United States Patent
Mieth et al.

(10) Patent No.: US 9,257,329 B2
(45) Date of Patent: Feb. 9, 2016

(54) METHODS FOR FABRICATING INTEGRATED CIRCUITS INCLUDING DENSIFYING INTERLEVEL DIELECTRIC LAYERS

(71) Applicant: GLOBALFOUNDRIES, Inc., Grand Cayman (KY)

(72) Inventors: Oliver Mieth, Dresden (DE); Carsten Peters, Dresden (DE); Torsten Huisinga, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 21 days.

(21) Appl. No.: 14/185,398

(22) Filed: Feb. 20, 2014

(65) Prior Publication Data

US 2015/0235896 A1 Aug. 20, 2015

(51) Int. Cl.
*H01L 21/3105* (2006.01)
*H01L 21/768* (2006.01)

(52) U.S. Cl.
CPC .... *H01L 21/76826* (2013.01); *H01L 21/76805* (2013.01); *H01L 21/76829* (2013.01); *H01L 21/76895* (2013.01); *H01L 21/3105* (2013.01)

(58) Field of Classification Search
CPC ............... H01L 21/3105; H01L 21/76834; H01L 21/76807; H01L 21/76819; H01L 21/76801; H01L 23/53295; H01L 23/5222; H01L 23/53238
USPC .......................... 438/787, 758; 257/E21.001
See application file for complete search history.

(56) References Cited

U.S. PATENT DOCUMENTS

2010/0109155 A1* 5/2010 Liu et al. .................. 257/734
2013/0178061 A1* 7/2013 Yamamoto et al. .......... 438/666

OTHER PUBLICATIONS

German Patent and Trade Mark Office, Office Action for German Patent Application No. 10 2014 209 002.4, mailed Jun. 30, 2014.

* cited by examiner

*Primary Examiner* — Evan Pert
*Assistant Examiner* — Changhyun Yi
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes densifying an upper-surface portion of an ILD layer of dielectric material that overlies a metallization layer above a semiconductor substrate to form a densified surface layer of dielectric material. The densified surface layer and the ILD layer are etched through to expose a metal line of the metallization layer.

19 Claims, 6 Drawing Sheets

METHODS FOR FABRICATING INTEGRATED CIRCUITS INCLUDING DENSIFYING INTERLEVEL DIELECTRIC LAYERS

TECHNICAL FIELD

The technical field relates generally to methods for fabricating integrated circuits, and more particularly relates to methods for fabricating integrated circuits including forming a back-end-of-the-line interconnect structure while reducing, minimizing, or preventing formation of voids in the interconnect structure.

BACKGROUND

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines run parallel to the substrate in the metallization layers and conductive vias run perpendicular to the substrate between the metallization layers to interconnect the metal lines.

High performance of contemporary ICs may be achieved using a highly conductive metal, such as copper, as the interconnect metal of the BEOL interconnect structure, which also employs a low dielectric constant (low-k) dielectric material as an interlevel dielectric (ILD) layer or layers. By "low k," it is meant that the dielectric constant of a particular dielectric material is less than that of silicon dioxide. Typically, the low-k properties of the low-k dielectric material are established by incorporating porosity (e.g. air) into a dielectric material such as silicon dioxide to form a porous dielectric material.

Conventional fabrication of BEOL interconnect structures include forming an ILD layer of, for example, a porous dielectric material overlying a semiconductor substrate. To protect the ILD layer, a cap layer is deposited overlying the ILD layer. The cap layer is typically a layer of non-porous, dense material such as SiON or the like. A hard mask layer is then deposited and patterned overlying the cap layer. Using the patterned hard mask layer as an etch mask, via-holes and metal line trenches are etched through the cap layer into the ILD layer. The via-holes and metal line trenches are then filled with a conductive metal to form the conductive vias and metal lines that form part of the BEOL interconnect structure. Unfortunately, during the etching process prior to the conductive metal fill, undercuts and/or bowing can occur underneath the cap layer along the sidewalls of the ILD layer that define the via-holes and/or metal line trenches because the lateral etch rate of the much denser, non-porous cap layer is typically substantially less (e.g., slower lateral etch rate) than the lateral etch rate of the relatively porous ILD layer. As such, the ILD layer etches more readily in a lateral direction than the cap layer resulting in portions of the cap layer overhanging the sidewalls of the ILD layer. These undercuts and/or bowing conditions can be difficult to fill with a conductive metal and voids can form in the BEOL interconnect structure due to incomplete metal filling of the via-holes and metal line trenches. These voids are undesirable and can create a number of issues including increasing the resistance of the BEOL interconnect structure.

Accordingly, it is desirable to provide methods for fabricating integrated circuits including forming a back-end-of-the-line interconnect structure while reducing, minimizing, or preventing the formation of voids in the interconnect structure. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes densifying an upper-surface portion of an ILD layer of dielectric material that overlies a metallization layer above a semiconductor substrate to form a densified surface layer of dielectric material. The densified surface layer and the ILD layer are etched through to expose a metal line of the metallization layer.

In accordance with another exemplary embodiment, a method for fabricating an integrated circuit is provided. The method includes providing a first ILD layer of dielectric material overlying a semiconductor substrate and a first metallization layer that is disposed in the first ILD layer. The first metallization layer includes a first metal line. A second ILD layer of dielectric material is formed overlying the first ILD layer. An upper-surface portion of the second ILD layer is exposed to a plasma treatment process to densify the upper-surface portion and form a densified surface layer of dielectric material. A via-hole is etched through the densified surface layer and the second ILD layer to expose the first metal line.

In accordance with another exemplary embodiment, a method for fabricating an integrated circuit is provided. The method includes providing a first ILD layer of dielectric material overlying a semiconductor substrate and a first metallization layer that is disposed in the first ILD layer and that includes a first metal line. A second ILD layer of dielectric material is formed overlying the first ILD layer. An upper-surface portion of the second ILD layer is plasma treated to densify the upper-surface portion and form a densified surface layer of dielectric material. A hard mask layer is deposited and patterned overlying the densified surface layer to form a patterned hard mask layer. The densified surface layer and the second ILD layer is etched through using the patterned hard mask layer to form a via-hole that exposes the first metal line and a metal line trench that is over and open to the via-hole. A via and a second metal line are formed in the via-hole and the metal line trench, respectively. The via electrically couples the first and second metal lines.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits including forming a back-end-of-the-line (BEOL) interconnect structure. Formation of the BEOL interconnect structure includes forming an ILD layer of dielectric material (e.g., a relatively porous dielectric material) overlying a semiconductor substrate. An upper-surface portion of the ILD layer is exposed to a plasma treatment process to densify the upper-surface portion and form a densified surface layer of dielectric material. In an exemplary embodiment, the densified surface layer is relatively more dense (e.g., less porous) than the ILD layer to help protect the ILD layer during subsequent processing but has some porosity such that the lateral etch rate of the densified surface layer is substantially the same as or similar to the lateral etch rate of the ILD layer. As such, the BEOL interconnect structure can be fabricated without depositing a dense, non-porous cap layer overlying the ILD layer. A via-hole and a metal line trench are etched through the densified surface layer and the ILD layer. A conductive metal fill is deposited in the via-hole and the metal line trench to correspondingly form a via and a metal line. It has been found that because the lateral etch rate of the densified surface layer is substantially the same as or similar to the lateral etch rate of the ILD layer, the sidewalls of the ILD layer that define the via-hole and the metal line trench can be formed without substantially undercutting the densified surface layer and/or without bowing relative to the densified surface layer. As such, in an exemplary embodiment, the via-hole and metal line trench can be substantially completely filled with the conductive metal without forming voids.

FIGS. 1-11 illustrate, in cross-sectional view, an integrated circuit (IC) 10 during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

Figure 1:
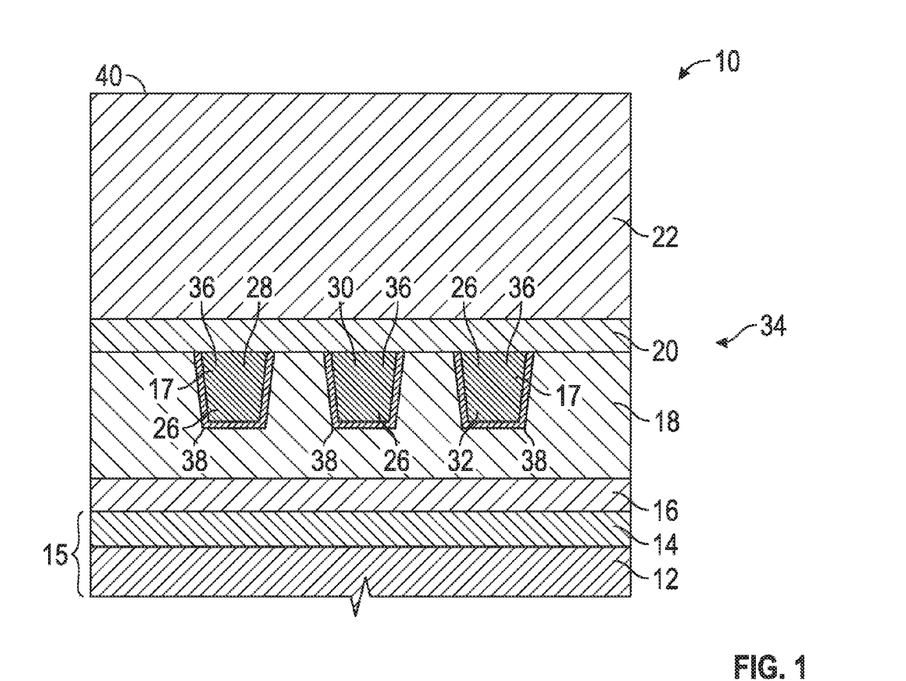
FIGS. 1-11 illustrate, in cross-sectional views, a method for fabricating an integrated circuit during various intermediate fabrication stages in accordance with an exemplary embodiment.

FIG. 1 illustrates a portion of the IC 10 during an intermediate fabrication stage in accordance with an exemplary embodiment. The IC 10 includes a substrate 12 that may represent any appropriate carrier material, such as silicon or silicon-based materials, and the like. Additionally, the IC 10 may include a semiconductor layer 14 that may be made up of active areas (not shown) in which a plurality of active and/or passive circuit elements (not shown), such as transistors, capacitors, resistors, and the like may be formed. Depending on the overall design strategy employed for the IC 10, the substrate 12 may in some cases be a substantially crystalline substrate material (i.e. bulk silicon), whereas in other instances the substrate 12 may be formed on the basis of a silicon-on-insulator (SOI) architecture, in which a buried insulating layer (not shown) may be provided between the semiconductor layer 14 and the substrate 12. It should be appreciated that the semiconductor layer 14, even if including a substantially silicon-based material layer, may include other semiconducting materials, such as germanium, carbon, and the like, in addition to appropriate dopant species for establishing the requisite active area conductivity type for the circuit elements. Together the substrate 12 and the semiconductor layer 14 form a semiconductor substrate 15 (e.g., substrate with a semiconductor portion).

Figure 11:
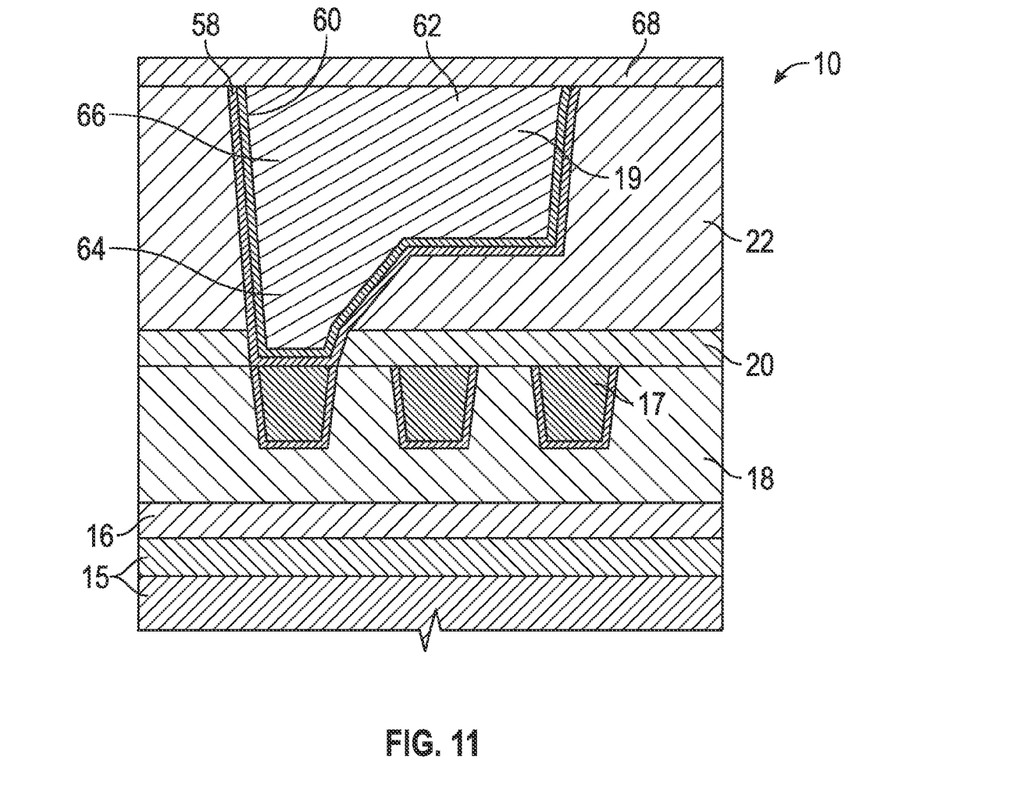

As illustrated, the IC 10 also includes a contact layer 16 that may be formed above the semiconductor layer 14. The contact layer 16 may be made up of a suitable dielectric material, such as silicon dioxide, silicon nitride, silicon oxynitride, and the like, and it may include a plurality of contact vias (not shown) as is well known in the art. Typically, the contact vias provide conductive electrical connections between one or more of the various circuit elements (not shown) disposed along the semiconductor layer 14 and the metallization layers 17 and 19 (see also FIG. 11). It is to be appreciated that the IC 10 may include the two metallization layers 17 and 19 (as illustrated in FIG. 11) or more than two metallization layers, depending on the overall device requirements.

As illustrated in FIG. 1, above the semiconductor substrate 15 and contact layer 16, the IC 10 includes the metallization layer 17 that is disposed in an ILD layer 18 of dielectric material (e.g., porous dielectric material as is known in the art), an N-doped silicon carbide (SiCN) layer 20 that overlies the ILD layer 18, and an ILD layer 22 of dielectric material (e.g., porous dielectric material) that overlies the N-doped silicon carbide (SiCN) layer 20. In an exemplary embodiment, the ILD layers 18 and 22 are each relatively thick independently with a thickness of from about 200 to about 1500 nm, and the N-doped SiCN layer 20 has a thickness of from about 10 to about 50 nm.

The metallization layer 17 includes a plurality of discrete and spaced apart metal lines 26 including a metal line 28, a metal line 30, and a metal line 32. In particular, the metal lines 26 form part of a BEOL interconnect structure 34 disposed above the contact layer 16. Each of the metal lines 26 are formed of a conductive metal fill 36 and a liner 38. The conductive metal fill 36 is a highly conductive material such as copper and the liner 38 is one or more layers of a liner-forming material such as tantalum (Ta), tantalum nitride (TaN), titanium (Ti), and/or titanium nitride (TiN) to help inhibit or prevent diffusion of the conductive metal fill 36 into the ILD layer 18. While BEOL interconnect structure 34 includes three metal lines in FIG. 1 for illustrative purposes, it will be appreciated that the BEOL interconnect structure 34 can contain any number of metal lines suitable for use in the IC 10.

The illustrated portion of the BEOL interconnect structure 34 may be formed on the basis of well-known techniques. In an exemplary embodiment, the ILD layer 18 is formed by depositing a dielectric material such as silicon dioxide or the like that includes some impurities (e.g., carbon or the like) overlying the contact layer 16 using a chemical vapor deposition (CVD) process and treating the dielectric material for example with UV radiation to out gas the impurities and form porosity in the ILD layer 18 to further lower the dielectric constant of the dielectric material. The top surface of the ILD layer 18 is planarized using a chemical mechanical planarization (CMP) process. Next, the ILD layer 18 is patterned and etched using, for example, a dry etching process to form metal line trenches, which are then filled by depositing a liner-forming material(s) and the conductive metal fill 36 into the metal line trenches using a physical vapor deposition (PVD) process (or an atomic layer deposition (ALD) process) and an electrochemical plating (ECP) process, respectively, to form the metal lines 26. Any overburden is removed by CMP. Next, the N-doped SiCN layer 20 is deposited overlying the ILD layer 18 and the metal lines 26 using a CVD process. The ILD layer 22 is then formed (e.g., via depositing and treating a dielectric material as discussed above in relation to the ILD layer 18) over the N-doped SiCN layer 20 followed by CMP to expose an upper-surface portion 40 of the ILD layer 22.

Figure 2:
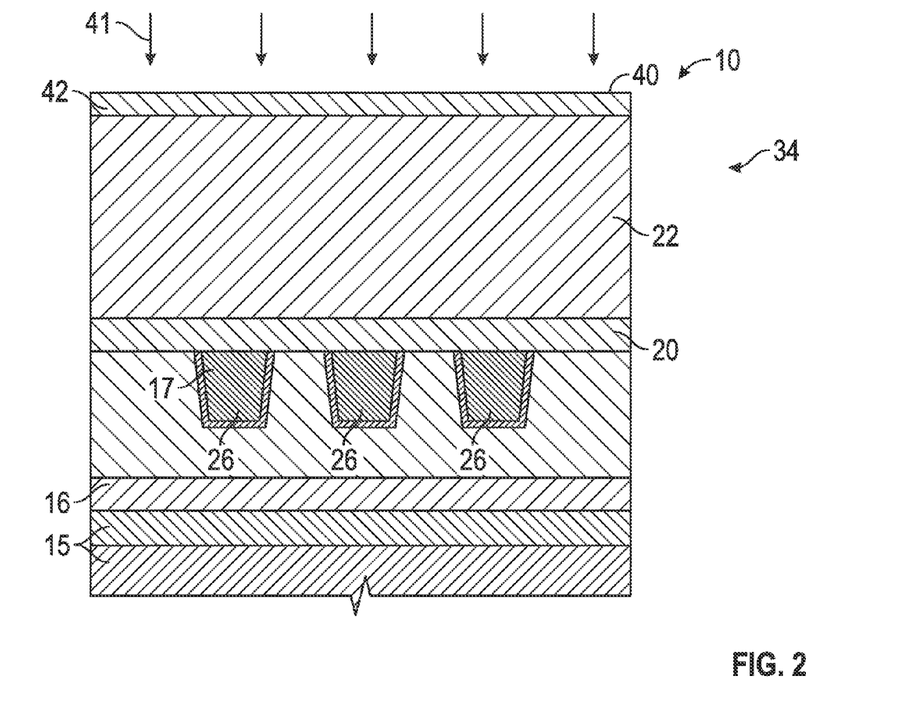

FIG. 2 illustrates the IC 10 during a further advanced fabrication stage in accordance with an exemplary embodiment. The upper-surface portion 40 of the ILD layer 22 is exposed to a plasma treatment process 41 to densify the upper-surface portion 40 and form a densified surface layer 42 of dielectric material. In an exemplary embodiment, the plasma treatment process 41 is a reactive ion etching (RIE) process that forms, for example, (helium) He ions that bombard the upper-surface portion 40 and reduce the porosity of the upper-surface portion 40 via reducing the size of the pores in the dielectric material to form the densified surface layer 42. Other precursor gases containing elements other than He may also be used for the plasma treatment process provided that the resulting ions densify the upper-surface portion 40 of the ILD layer 22 rather than etch or otherwise substantially remove the upper-surface portion 40. In an exemplary embodiment, the densified surface layer 42 has a lateral etch rate substantially the same as or similar to the lateral etch rate of the ILD layer 22 that is disposed beneath the densified surface layer 42. In an exemplary embodiment, the densified surface layer 42 has a thickness of from about 1 to about 20 nm, such as from about 5 to about 15 nm, for example from about 7 to about 13 nm.

Figure 3:
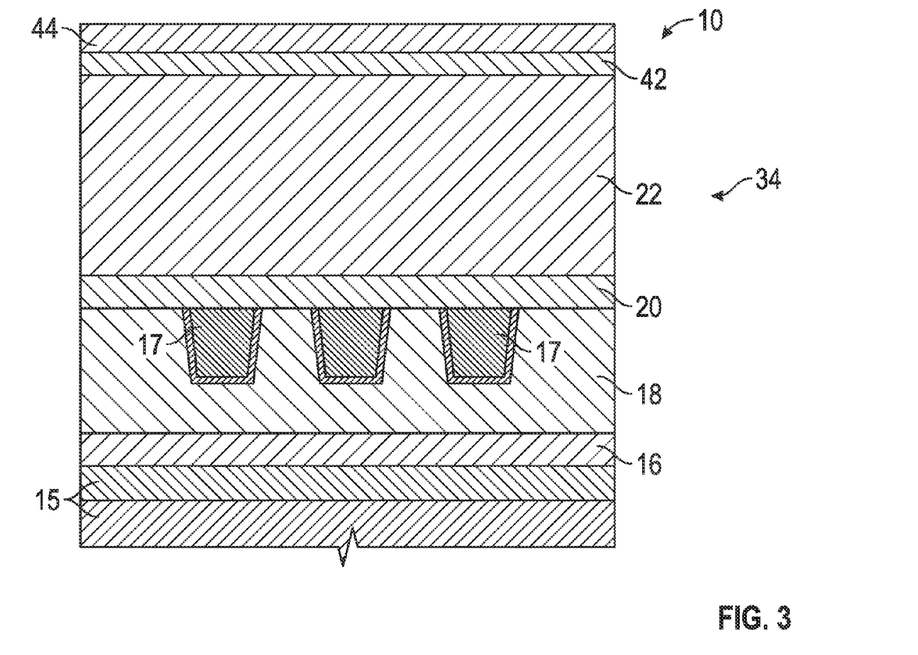
Figure 4:
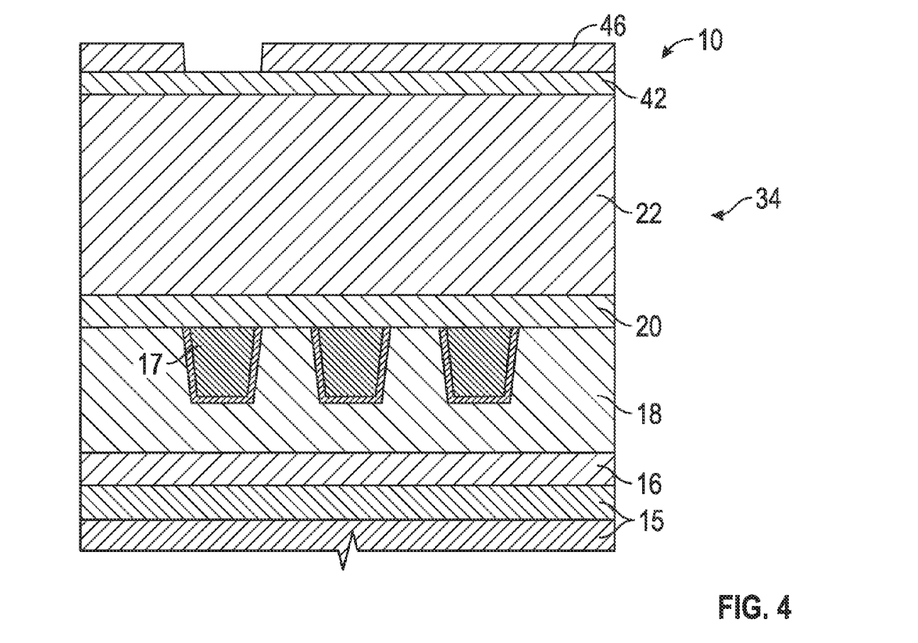
Figure 5:
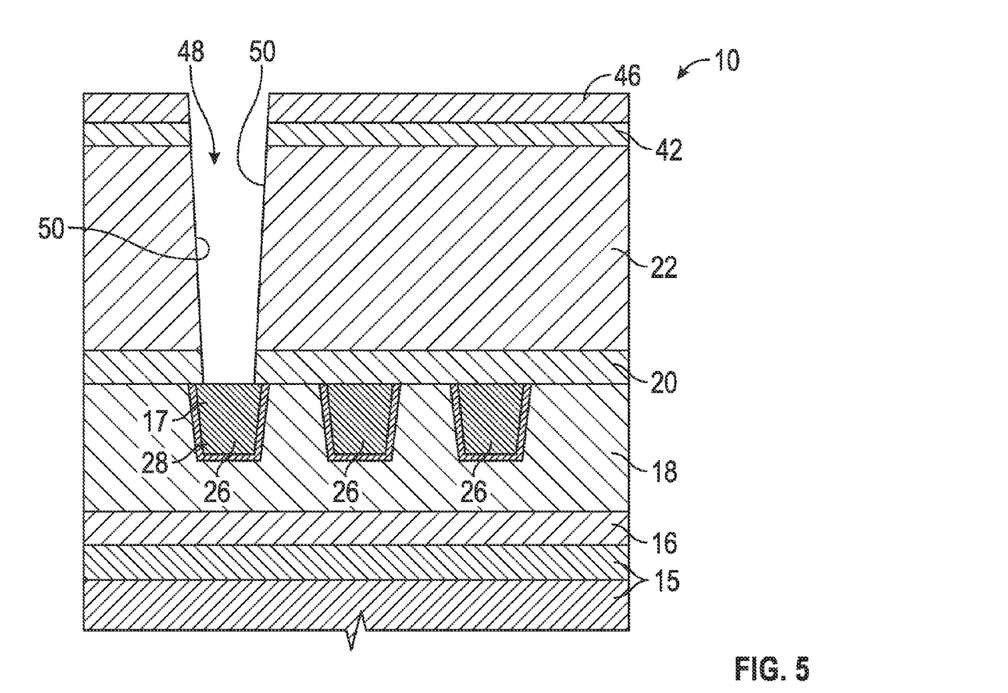

The process continues as illustrated in FIGS. 3-5 by depositing and patterning a hard mask layer 44 to form a patterned hard mask layer 46 overlying the densified surface layer 42. In an exemplary embodiment, the hard mask layer 44 is a metal hard mask layer formed of titanium nitride (TiN). The patterned hard mask layer 46 may be formed using well-known deposition, lithography, and etching techniques.

The patterned hard mask layer 46 is used as an etch mask and a via-hole 48 is etched through the densified surface layer 42, the ILD layer 22, and the N-doped SiCN layer 20 to expose the metal line 28. The via-hole 48 may be formed using well-known etching techniques such as a dry etching process (e.g., a plasma etching process). As illustrated, in an exemplary embodiment, the sidewalls 50 of the via-hole 48 are relatively straight (e.g., non-bowed and tapered or sloped inwardly) and portions of the densified surface layer 42 do not overhang the ILD layer 22 so as to create an undercut condition in the underlying ILD layer 22 because the lateral etch rate of the densified surface layer 42 is substantially the same as or similar to the lateral etch rate of the ILD layer 22.

Figure 6:
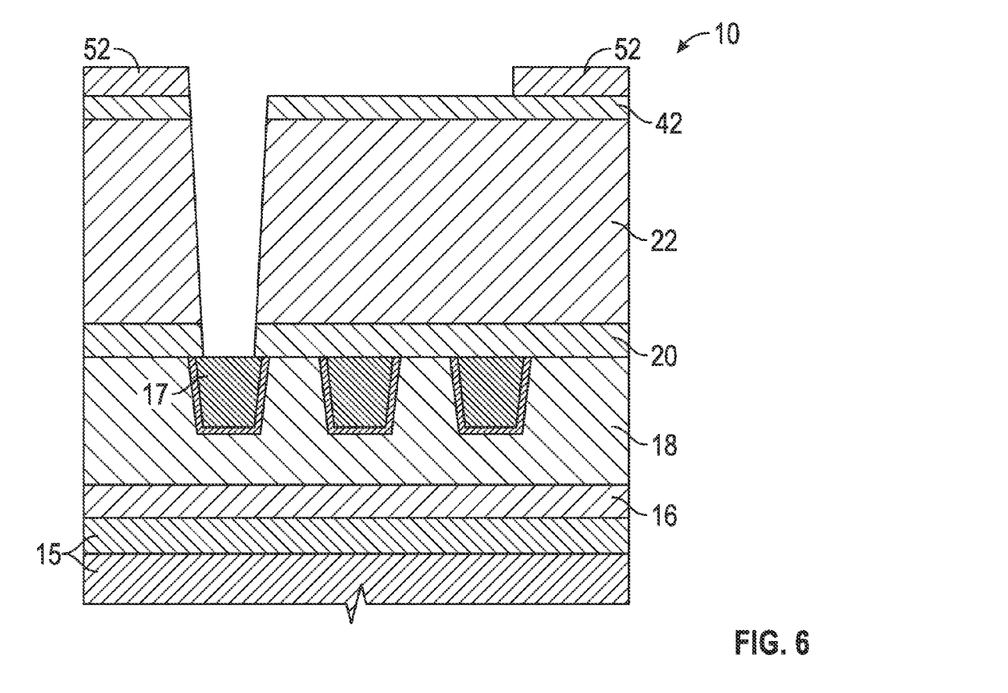
Figure 7:
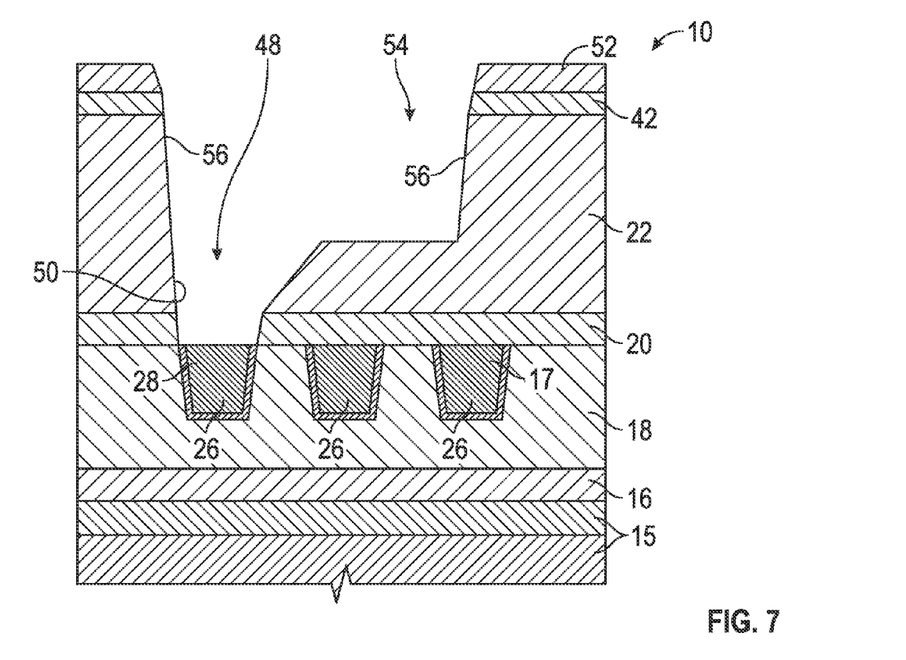

The process continues as illustrated in FIGS. 6-7 by further patterning the patterned hard mask layer 46 to form a patterned hard mask layer 52. The patterned hard mask layer 52 is used as an etch mask and the densified surface layer 42 and the ILD layer 22 are further etched to selectively remove portions of the densified surface layer 42 and upper portions of the ILD layer 22 adjacent to the via-hole 48 to form a metal line trench 54. The metal line trench 54 may be formed using well-known etching techniques such as a dry etching process. As illustrated, in an exemplary embodiment, the sidewalls 56 of the metal line trench 54 are relatively straight (e.g., non-bowed and tapered or sloped inwardly) and portions of the densified surface layer 42 do not overhang the ILD layer 22 so as to create an undercut condition in the underlying ILD layer 22 because the lateral etch rate of the densified surface layer 42 is substantially the same as or similar to the lateral etch rate of the ILD layer 22.

In an alternative embodiment with reference to FIGS. 3 and 7, the metal line trench 54 may be formed prior to the formation of the via-hole 48 by depositing and patterning the hard mask layer 44 to form the patterned hard mask layer 52 and subsequently etching to form the metal line trench 54. Next, a layer of photoresist may be deposited and patterned overlying the densified surface layer 42 and the metal line trench 54, and the via-hole 48 is etched using the patterned photoresist layer as an etch mask.

Figure 8:
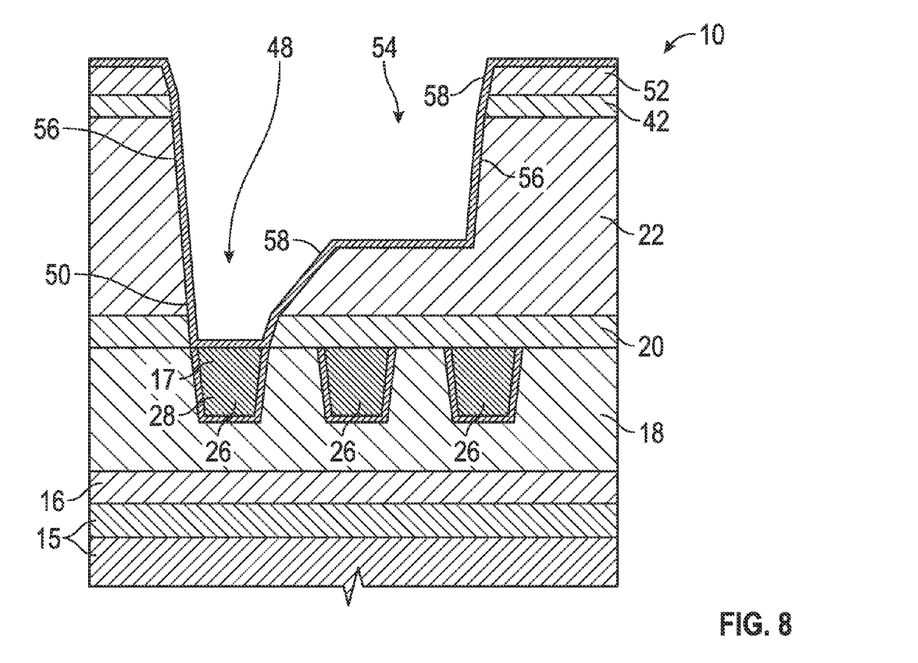

FIG. 8 illustrates the portion of the IC 10 during a further advanced fabrication stage in accordance with an exemplary embodiment. A liner-forming material(s) is deposited overlying a top surface of the patterned hard mask layer 52, the sidewalls 50 and 56 of the ILD layer 22 that define the via-hole 48 and the metal line trench 54, and an upper surface of the metal line 28 to form a liner 58. In an exemplary embodiment, the liner-forming material(s) includes Ta, TaN, Ti, and/or TiN and is deposited using a PVD process, an ALD process, or the like.

Figure 9:
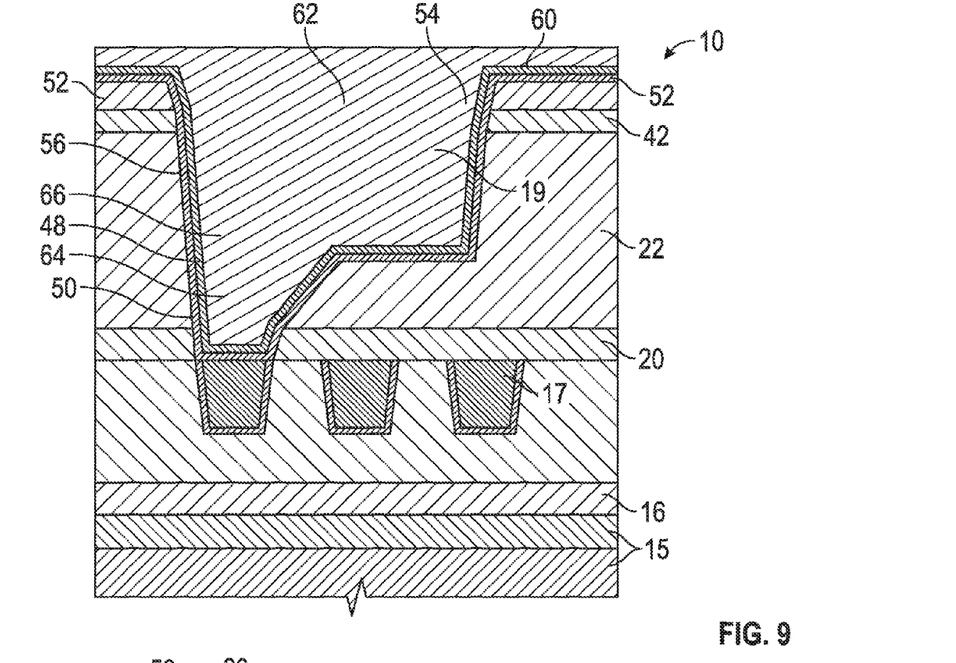

The process continues as illustrated FIG. 9 by depositing a copper seed layer 60 overlying the liner 58. In an exemplary embodiment, the copper seed layer 60 is deposited using a PVD process. A conductive metal fill 62 (e.g., copper or copper alloy) is then deposited overlying the copper seed layer 60 to form a via 64 and a metal line 66 in the via-hole 48 and the metal line trench 54, respectively, to define the metallization layer 19. In an exemplary embodiment, because the sidewalls 50 and 56 of the ILD layer 22 that define the via-hole 48 and the metal line trench 54 are formed without substantially undercutting the densified surface layer 42 and/or without bowing relative to the densified surface layer 42, the via-hole 48 and metal line trench 54 can be substantially completely filled with the conductive metal fill 62 without forming voids.

Figure 10:
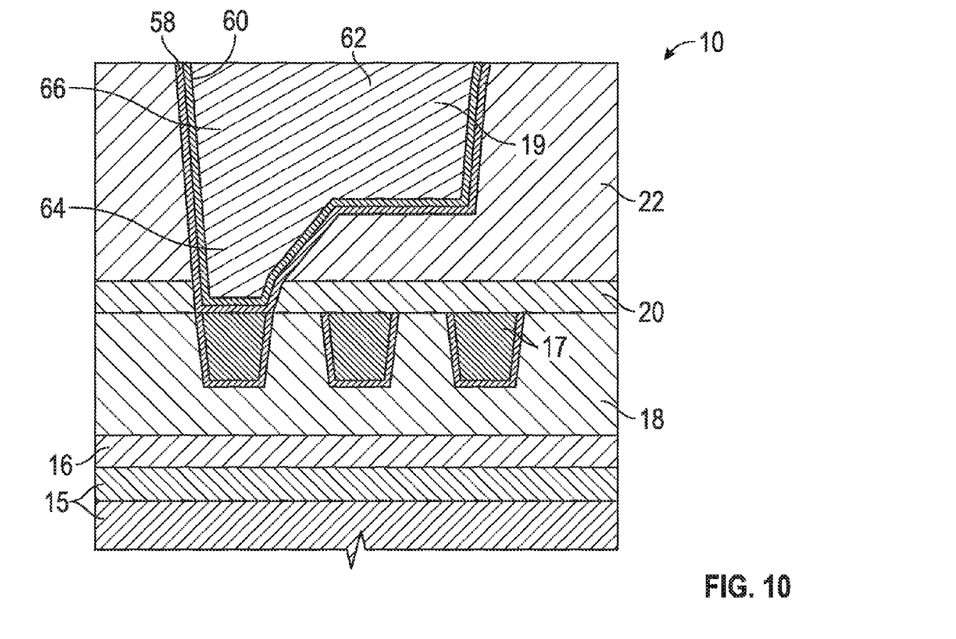

The process continues by planarizing the IC 10 using a CMP process to remove any excess conductive metal fill 62, the patterned hard mask layer 52, and the densified surface layer 42 as illustrated in FIG. 10. In an exemplary embodiment, the CMP process additionally removes from about 5 to about 20 nm of dielectric material from an upper portion of the ILD layer 22 below the densified surface layer 42. An N-doped SiCN layer 68 is then deposited overlying the ILD layer 22 as illustrated in FIG. 11.

Accordingly, methods for fabricating integrated circuits have been described. In an exemplary embodiment, an integrated circuit is fabricated by densifying an upper-surface portion of an ILD layer of dielectric material that overlies a metallization layer above a semiconductor substrate to form a densified surface layer of dielectric material. The densified surface layer and the ILD layer are etched through to expose a first metal line of the metallization layer. A via and a second metal line are formed in the via-hole and the metal line trench, respectively. The via electrically couples the first and second metal lines.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   densifying an upper-surface portion of an interlevel dielectric (ILD) layer of dielectric material that overlies a metallization layer above a semiconductor substrate to form a densified surface layer of dielectric material, wherein the densified surface layer has a thickness of from about 1 to about 20 nm; and etching through the densified surface layer and the ILD layer to expose a metal line of the metallization layer.

2. The method of claim 1, wherein densifying comprises exposing the upper-surface portion to a plasma treatment process.

3. The method of claim 2, wherein exposing comprises exposing the upper-surface portion to a reactive ion etching (RIE) process as the plasma treatment process.

4. The method of claim 2, wherein exposing comprises bombarding the upper-surface portion with He ions using the plasma treatment process to densify the upper-surface portion.

5. A method for fabricating an integrated circuit, the method comprising:
   providing a first interlevel dielectric (ILD) layer of dielectric material overlying a semiconductor substrate and a first metallization layer that is disposed in the first ILD layer and that comprises a first metal line;
   forming a second ILD layer of dielectric material overlying the first ILD layer;
   exposing an upper-surface portion of the second ILD layer to a plasma treatment process to densify the upper-surface portion and form a densified surface layer of dielectric material, wherein the densified surface layer has a thickness of from about 1 to about 20 nm; and
   etching a via-hole through the densified surface layer and the second ILD layer to expose the first metal line.

6. The method of claim 5, further comprising etching the densified surface layer and an upper portion of the second ILD layer below the densified surface layer and adjacent to the via-hole to form a metal line trench that is over and open to the via-hole.

7. The method of claim 6, further comprising forming a liner in the via-hole and the metal line trench.

8. The method of claim 7, wherein forming the liner comprises depositing a liner-forming material using a physical vapor deposition (PVD) process or an atomic layer deposition (ALD) process.

9. The method of claim 7, further comprising depositing a conductive metal seed layer in the via-hole and the metal line trench overlying the liner.

10. The method of claim 9, wherein depositing the conductive metal seed layer comprises depositing the conductive metal seed layer using a physical vapor deposition (PVD) process.

11. The method of claim 9, further comprising depositing a conductive metal fill in the via-hole and the metal line trench overlying the conductive metal seed layer.

12. The method of claim 11, wherein depositing the conductive metal fill comprises depositing the conductive metal fill using an electrochemical plating (ECP) process.

13. The method of claim 5, further comprising depositing a N-doped silicon carbide layer overlying the first ILD layer, wherein depositing the second ILD layer comprises depositing the second ILD layer overlying the N-doped silicon carbide layer, and wherein etching the via-hole comprises etching the via-hole through the densified surface layer, the second ILD layer, and the N-doped silicon carbide layer.

14. A method for fabricating an integrated circuit, the method comprising:
   providing a first interlevel dielectric (ILD) layer of dielectric material overlying a semiconductor substrate and a first metallization layer that is disposed in the first ILD layer and that comprises a first metal line;
   forming a second ILD layer of dielectric material overlying the first ILD layer;
   plasma treating an upper-surface portion of the second ILD layer to densify the upper-surface portion and form a densified surface layer of dielectric material, wherein the densified surface layer has a thickness of from about 1 to about 20 nm;
   depositing and patterning a hard mask layer overlying the densified surface layer to form a patterned hard mask layer;
   etching through the densified surface layer and the second ILD layer using the patterned hard mask layer to form a via-hole that exposes the first metal line and a metal line trench that is over and open to the via-hole; and
   forming a via and a second metal line in the via-hole and the metal line trench, respectively, wherein the via electrically couples the first and second metal lines.

15. The method of claim 14, wherein depositing the hard mask layer comprises depositing a metal hard mask layer overlying the densified surface layer.

16. The method of claim 15, wherein depositing the hard mask layer comprises depositing the metal hard mask layer comprising titanium nitride (TiN).

17. The method of claim 14, further comprising removing the densified surface layer after forming the via and the second metal line using a CMP process.

18. The method of claim 17, wherein removing the densified surface layer comprises removing the densified surface layer and about 5 to about 20 nm of depth of the dielectric material from the upper portion of the second ILD layer using the CMP process to planarized the second ILD layer.

19. The method of claim 17, further comprising depositing a N-doped silicon carbide layer overlying the second ILD layer after removing the densified surface layer.

* * * * *